United States Patent
Galton et al.

(10) Patent No.: US 9,602,113 B2
(45) Date of Patent: Mar. 21, 2017

(54) FAST FREQUENCY THROTTLING AND RE-LOCKING TECHNIQUE FOR PHASE-LOCKED LOOPS

(71) Applicant: QUALCOMM Incorporated, San Diego, CA (US)

(72) Inventors: Ian Andrew Galton, Del Mar, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/566,859

(22) Filed: Dec. 11, 2014

(65) Prior Publication Data

US 2016/0065224 A1 Mar. 3, 2016

Related U.S. Application Data

(60) Provisional application No. 62/042,646, filed on Aug. 27, 2014.

(51) Int. Cl.
| | | |
|---|---|---|
| H03L 7/06 | (2006.01) |
| H03L 7/093 | (2006.01) |
| H03L 7/14 | (2006.01) |
| H03L 7/099 | (2006.01) |
| H03M 3/00 | (2006.01) |

(52) U.S. Cl.
CPC ........... *H03L 7/093* (2013.01); *H03L 7/0991* (2013.01); *H03L 7/146* (2013.01); *H03M 3/458* (2013.01)

(58) Field of Classification Search
None
See application file for complete search history.

(56) References Cited

U.S. PATENT DOCUMENTS

| | | |
|---|---|---|
| 5,757,239 A | 5/1998 | Gilmore |
| 6,762,629 B2 | 7/2004 | Tam et al. |
| 7,863,952 B2 | 1/2011 | Friedman et al. |
| 8,604,852 B1 | 12/2013 | Turullols et al. |
| 2004/0232995 A1* | 11/2004 | Thomsen ............... H03L 1/022 331/2 |
| 2006/0047987 A1 | 3/2006 | Prabhakaran et al. |
| 2013/0222016 A1 | 8/2013 | Ichikawa |

(Continued)

OTHER PUBLICATIONS

Galton I., et al., "A Delta-Sigma PLL for 14b 50kSample/s Frequency-to-Digital Conversion of a 10 MHz FM Signal," IEEE Journal of Solid State Circuits, Dec. 1998, vol. 33, No. 12, pp. 2042-2053.

(Continued)

*Primary Examiner* — Cassandra Cox
(74) *Attorney, Agent, or Firm* — Patterson & Sheridan, L.L.P.

(57) ABSTRACT

Certain aspects of the present disclosure support a method and apparatus for fast frequency throttling and re-locking in a phase-locked loop (PLL) device. Aspects of the present disclosure present a method and apparatus for operating in an open loop control (OLC) mode of the PLL device for generating a periodic signal. During the OLC mode, clocking of circuitry interfaced with a digitally-controlled oscillator (DCO) of the PLL device can be disabled. A PLL output frequency associated with the periodic signal generated by the DCO can be controlled directly through a digital control word input into the DCO.

28 Claims, 5 Drawing Sheets

(56) References Cited

U.S. PATENT DOCUMENTS

2013/0295843 A1* 11/2013 Tian .................. H04B 5/00
                                                        455/41.1
2013/0300477 A1* 11/2013 Ueda ................ H03L 7/099
                                                        327/159
2013/0307631 A1    11/2013 Lotfy et al.

OTHER PUBLICATIONS

Venerus C., et al., "Delta-Sigma FDC Based Fractional-N PLLs," IEEE Transactions on Circuits and Systems-I: Regular Papers, May 2013, vol. 60, No. 5, pp. 1274-1285.
International Search Report and Written Opinion—PCT/US2015/042452—ISA/EPO—Nov. 18, 2015.
Kim J-H., et al., "A 120-MHz-1.8-GHz CMOS DLL-Based Clock Generator for Dynamic Frequency Scaling", IEEE Journal of Solid-State Circuits., XP055220080, Sep. 1, 2006, vol. 41, No. 9, pp. 2077-2082, ISSN: 0018-9200, DOI:10.1109/JSSC.2006.880609.

* cited by examiner

FAST FREQUENCY THROTTLING AND RE-LOCKING TECHNIQUE FOR PHASE-LOCKED LOOPS

CLAIM OF PRIORITY UNDER 35 U.S.C. §119

This application claims benefit of U.S. Provisional Patent Application Ser. No. 62/042,646, filed Aug. 27, 2014 and entitled "Fast Frequency Throttling and Re-Locking Technique for Phase-Locked Loops", incorporated by reference in its entirety.

BACKGROUND

Field

Certain aspects of the present disclosure generally relate to electronic circuits and, more particularly, to a method and apparatus for fast frequency throttling and re-locking for a phase-locked loop (PLL) device utilized in various electronic applications and apparatuses.

Background

A phase-locked loop (PLL) is an electronic system or a device that generates an output signal whose phase is related to a phase of an input signal. PLL devices are utilized in various electronic applications, including but not limited to computers and communications (e.g., wireless communications). PLLs are used to generate a stable frequency in multiples or in fractional multiples of an input frequency, which can be employed as a clock frequency in digital circuits such as microprocessors.

SUMMARY

Certain aspects of the present disclosure provide a method for operating a phase-locked loop (PLL) device for generating a periodic signal. The method generally includes locking, in a first operating mode of the PLL device, a PLL output frequency associated with the periodic signal to a target value, switching operation of the PLL device from the first operating mode to a second operating mode, such that a state of the PLL device in the first operating mode is preserved, disabling, during the second operating mode, operation of circuitry interfaced with a digitally-controlled oscillator (DCO) of the PLL device, controlling, during the second operating mode, the PLL output frequency associated with the periodic signal generated by the DCO directly through a digital control word input into the DCO, and switching operation of the PLL device from the second operating mode back to the first operating mode, wherein the preserved state of the PLL device is restored and the PLL output frequency is locked to the target value.

Certain aspects of the present disclosure provide an apparatus for operating a phase-locked loop (PLL) device for generating a periodic signal. The apparatus generally includes a processing system configured to lock, in a first operating mode of the PLL device, a PLL output frequency associated with the periodic signal to a target value, switch operation of the PLL device from the first operating mode to a second operating mode, such that a state of the PLL device in the first operating mode is preserved, disable, during the second operating mode, operation of circuitry interfaced with a digitally-controlled oscillator (DCO) of the PLL device, control, during the second operating mode, the PLL output frequency associated with the periodic signal generated by the DCO directly through a digital control word input into the DCO, and switch operation of the PLL device from the second operating mode back to the first operating mode, wherein the preserved state of the PLL device is restored and the PLL output frequency is locked to the target value, and a memory coupled to the processing system.

Certain aspects of the present disclosure provide an apparatus for operating a phase-locked loop (PLL) device for generating a periodic signal. The apparatus generally includes means for locking, in a first operating mode of the PLL device, a PLL output frequency associated with the periodic signal to a target value, means for switching operation of the PLL device from the first operating mode to a second operating mode, such that a state of the PLL device in the first operating mode is preserved, means for disabling, during the second operating mode, operation of circuitry interfaced with a digitally-controlled oscillator (DCO) of the PLL device, means for controlling, during the second operating mode, the PLL output frequency associated with the periodic signal generated by the DCO directly through a digital control word input into the DCO, and means for switching operation of the PLL device from the second operating mode back to the first operating mode, wherein the preserved state of the PLL device is restored and the PLL output frequency is locked to the target value.

Certain aspects of the present disclosure provide a computer-readable medium having instructions executable by a computer stored thereon. The instructions are generally capable for locking, in a first operating mode of a phase-locked loop (PLL) device for generating a periodic signal, a PLL output frequency associated with the periodic signal to a target value, switching operation of the PLL device from the first operating mode to a second operating mode, such that a state of the PLL device in the first operating mode is preserved, disabling, during the second operating mode, operation of circuitry interfaced with a digitally-controlled oscillator (DCO) of the PLL device, controlling, during the second operating mode, the PLL output frequency associated with the periodic signal generated by the DCO directly through a digital control word input into the DCO, and switching operation of the PLL device from the second operating mode back to the first operating mode, wherein the preserved state of the PLL device is restored and the PLL output frequency is locked to the target value.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
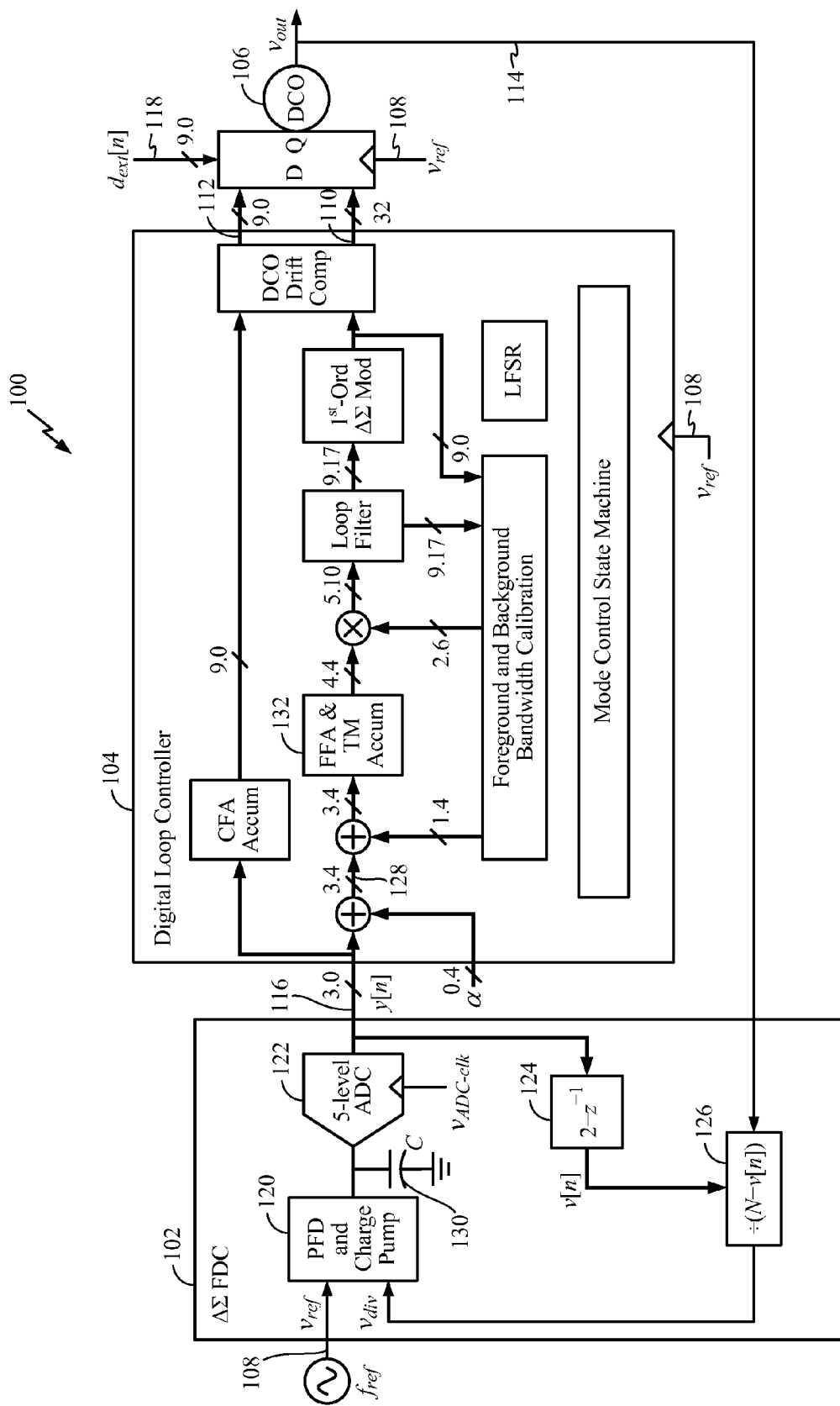
FIG. 1 illustrates an example high-level block diagram of a frequency-to-digital converter based phase-locked loop (FDC-PLL), in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Operational Modes of Frequency-to-Digital Converter Based Phase-Locked Loop

An electrical current drawn by a microprocessor tends to be highly variable over time, depending on factors such as computational loading. Therefore, supply current surges sometimes occur that cause brief droops in the microprocessor's supply voltage from time to time. If the microprocessor is being clocked at its maximum rate when such a voltage droop occurs, it is desirable to rapidly reduce its clock rate to avoid timing failures. Then, when the voltage returns to normal, it is desirable to return rapidly to the original clock rate to achieve a maximum microprocessor throughput. Moreover, when returning to the original clock rate, it is preferred that no clock rate overshoot occurs or else timing failures may occur. Unfortunately, these supply voltage droop events are often very rapid, and the phase-locked loops (PLLs) that generate microprocessor clock signals may have bandwidths that are far too low to allow the type of rapid frequency throttling described above.

The method and apparatus presented in this disclosure provides a solution to this problem. According to certain aspects of the present disclosure, the presented technique may apply to a frequency-to-digital converter based PLL (FDC-PLL) device with an example block-diagram 100 illustrated in FIG. 1. In an aspect, the FDC-PLL 100 can be used, for example, as a clock source for 20 nm microprocessors. The novel technique presented in this disclosure is a mode of the FDC-PLL, called open loop control (OLC) mode, and its associated control logic and methodology.

In accordance with certain aspects of the present disclosure, the OLC mode can be entered any time after the FDC-PLL has entered a tracking mode, i.e., any time after it has locked to a given frequency. In an aspect of the present disclosure, the OLC mode can be entered when an external pin is set high and exited when the pin is set low. When the OLC mode is entered, the FDC-PLL can be instantly taken out of lock and its output frequency can be controlled by a digital control word supplied externally to the FDC-PLL. In an aspect, the digital control word can be applied directly to a digitally-controlled oscillator (DCO) within the FDC-PLL. The DCO typically has a very wide bandwidth, so this approach may allow the frequency to be throttled very rapidly. When the OLC mode is exited, the FDC-PLL can be reconfigured such that it goes back quickly (e.g., within a microsecond) into the tracking mode, and its output frequency goes back to the frequency it had just prior to the OLC mode without overshoot.

FDC-PLL Operation

FIG. 1 illustrates the example 100 of a high-level block diagram of the FDC-PLL, in which aspects of the present disclosure may be practiced, in accordance with certain aspects of the present disclosure. As illustrated in FIG. 1, the FDC-PLL 100 may comprise three main components: a delta-sigma frequency-to-digital converter (FDC) 102, a digital loop controller 104, and a DCO 106. In an aspect of the present disclosure, the digital loop controller 104 is an all-digital block clocked on each rising edge of a reference signal 108. The controller 104 may generate a 32-bit fine DCO control sequence 110, $f_{fine}[n]$, and a 9-bit coarse DCO control sequence 112, $f_{coarse}[n]$. The two sequences may be latched into the DCO 106 on each rising edge of the reference signal 108. In an aspect of the present disclosure, the delta-sigma FDC 102 may compare the reference signal 108 to the DCO output signal 114, and may generate a 3-bit output sequence 116.

In accordance with certain aspects of the present disclosure, the FDC-PLL 100 illustrated in FIG. 1 may have four modes of operation: coarse frequency acquisition (CFA) mode, fine frequency acquisition (FFA) mode, tracking mode, and open loop control (OLC) mode. Whenever the FDC-PLL 100 is reset (which should happen whenever it is powered up or the desired frequency is changed), under normal operation it first enters the CFA mode, then the FFA mode, and then the tracking mode. During the CFA mode, $f_{coarse}[n]$ may be adjusted to rapidly slew the DCO frequency to within $f_{ref}$ of the desired output frequency, where $f_{ref}$ is the reference frequency (e.g., $f_{ref}$=19.2 MHz).

During the FFA mode, foreground bandwidth calibration may be performed and $f_{fine}[n]$ may be adjusted to lock the PLL to the desired output frequency, at which point the PLL enters tracking mode. In an aspect of the present disclosure, the OLC mode may be entered at a request of a user. In this mode, the DCO 106 may be taken out of phase lock and the user can change the frequency of the DCO 106 as desired by changing a codeword 118, $d_{ext}[n]$. The OLC mode may persist until control of the DCO 106 is relinquished by the user and tracking mode is re-established. In an aspect of the present disclosure, the purpose of the OLC mode is to allow digitally controlled throttling of the output frequency with rapid transition (e.g., less than a microsecond) back to tracking mode.

Delta-Sigma FDC

In accordance with certain aspects of the present disclosure, the delta-sigma FDC 102 may be used in all modes except for the OLC mode. As illustrated in FIG. 1, the FDC 102 may comprise a phase-frequency detector (PFD) 120, a charge pump (illustrated in FIG. 1 as a part of the PFD 120), a 5-level analog-to-digital converter (ADC) 122, $2-z^{-1}$ block 124, and a multi-modulus divider 126. In an aspect of the present disclosure, the FDC output 116, y[n], is a 5-level digital sequence with a sample-rate equal to the reference frequency, $f_{ref}$.

For certain aspects of the present disclosure, the FDC output y[n] may be represented as a sum of two terms. One of the terms may be proportional to $Nf_{ref}$ minus the average frequency of the DCO 106 over the reference period, where N is the integer portion of the frequency control word chosen by the user. The other term represents second-order high-pass shaped quantization noise identical to that of a second-order delta-sigma modulator with a noise transfer function of $(1-z^{-1})^2$. Therefore, the delta-sigma FDC 102 may effectively measure the average frequency of the DCO 106 each reference period and introduce second-order high-pass spectrally shaped quantization noise.

During the FFA mode and the tracking mode, the digital loop controller 104 may perform low-pass filtering of the quantization noise and adjust the DCO frequency so as to null a codeword 128, y[n]+α. This may force the average DCO frequency to $(N+\alpha) \cdot f_{ref}$, where α is the fractional portion of the frequency control word chosen by the user with a value between −½ and ½.

The PFD and charge pump 120 may be similar to those in conventional analog PLLs, but unlike in a conventional analog PLL, the transfer functions of the FDC-PLL 100 can be chosen independently of the charge pump current and the capacitor 130 driven by the charge pump 120. Therefore, the charge pump current and capacitance can be much smaller than those of a comparable analog PLL.

In an aspect of the present disclosure, the 5-level ADC 122 may be a flash ADC consisting of four comparators that compare the voltage across the capacitor 130 to four reference voltages with a nominal adjacent spacing of Δ volts. The ADC 122 may sample its input each reference period after the charge pump current sources are turned off and have settled to zero, but well before the next reference period. In an aspect of the present disclosure, the $2-z^{-1}$ block 124 calculates each reference period:

$$v[n]=2y[n]-y[n-1], \quad (1)$$

as soon as y[n] is available and updates the divider modulus 126 such that the next divider edge occurs N−v[n] DCO periods from the time of the most recent divider edge.

Tracking Mode

Figure 2:
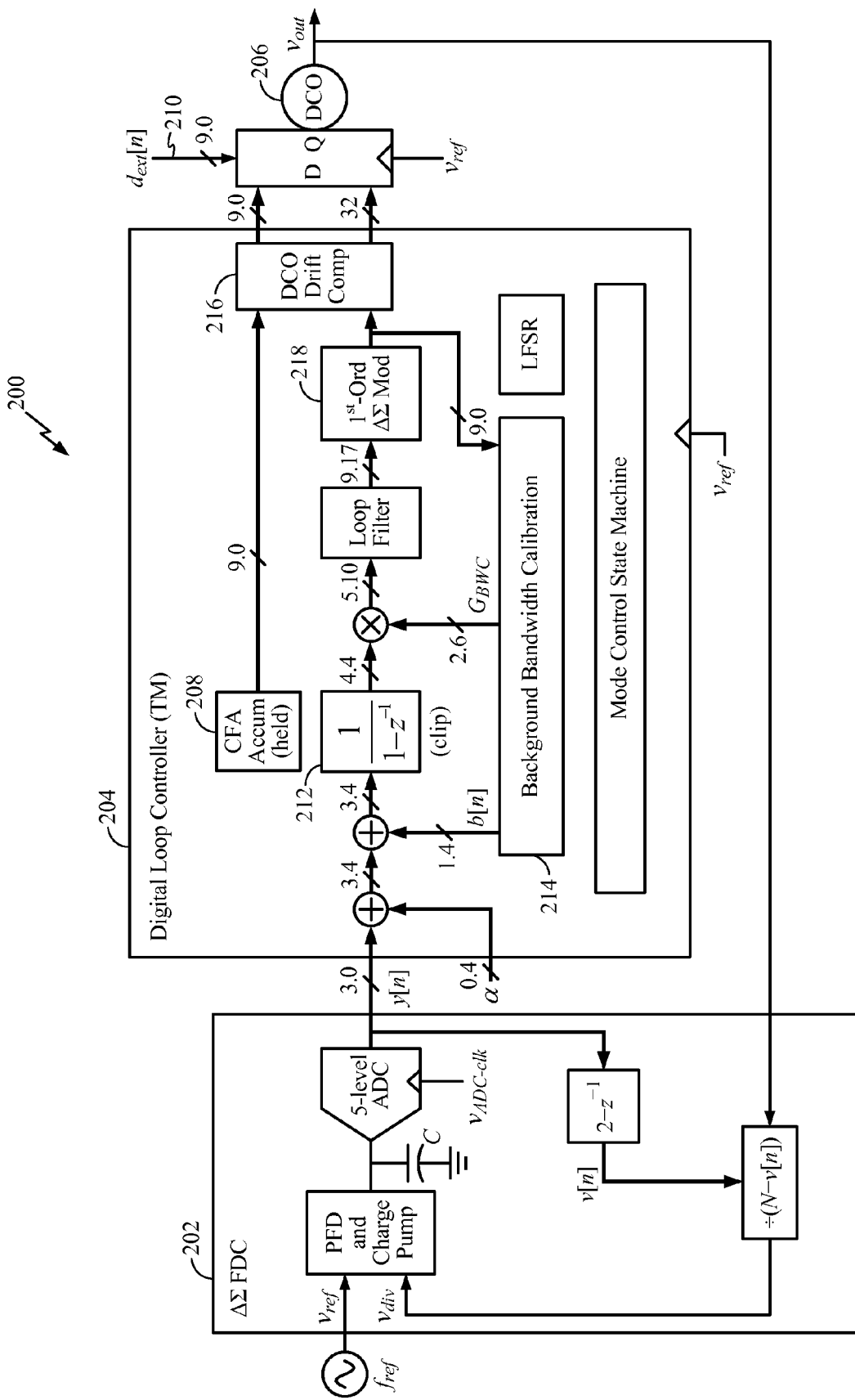
FIG. 2 illustrates an example block diagram of the FDC-PLL during tracking mode, in accordance with certain aspects of the present disclosure.

FIG. 2 illustrates an example 200 of the high-level architecture of the FDC-PLL during tracking mode, in accordance with certain aspects of the present disclosure. In this mode, the FDC-PLL comprises the delta-sigma FDC 202, the digital loop controller block 204 configured for tracking mode, and the DCO 206. It should be noted that the Coarse Frequency Acquisition (CFA) accumulator 208 is not clocked during tracking mode, and it is held at the value it had when tracking mode was entered. Furthermore, it can be assumed that the value of codeword 210, $d_{ext}[n]$, is not changed during tracking mode. In an aspect of the present disclosure, the accumulation block 212 labeled $1/(1-z^{-1})$ in FIG. 2 is the same as the block 132 labeled in FIG. 1 as "FFA & TM Accum" (i.e., Fine Frequency Acquisition and Tracking Mode Accumulator).

During tracking mode, the FDC-PLL 200 may incorporate four tracking loops: the delta-sigma FDC, the DCO control loop, the DCO drift compensator, and the background bandwidth calibration loop (i.e., performed by background bandwidth calibration block 214). The delta-sigma FDC and the DCO control loop may together implement the phase-locking functionality of the FDC-PLL 200. In accordance with certain aspects of the present disclosure, the DCO drift compensator 216 may adjust for DCO center frequency drift, and the background bandwidth calibration loop may adaptively adjust the open-loop gain of the DCO control loop to compensate for loop gain variations (which arise primarily from DCO gain variability).

As illustrated in FIG. 2, the FDC-PLL 200 may also comprise a first-order digital delta-sigma modulator 218 that quantizes the input control word to the DCO 206. In an aspect of the present disclosure, the purpose of modulator 218 is to simplify the DCO design. Although the modulator 218 may add quantization noise with comparable power to that introduced by the delta-sigma FDC 202, the noise is within the target specifications of the FDC-PLL representing an acceptable tradeoff.

Open-Loop Control Mode

Figure 3:
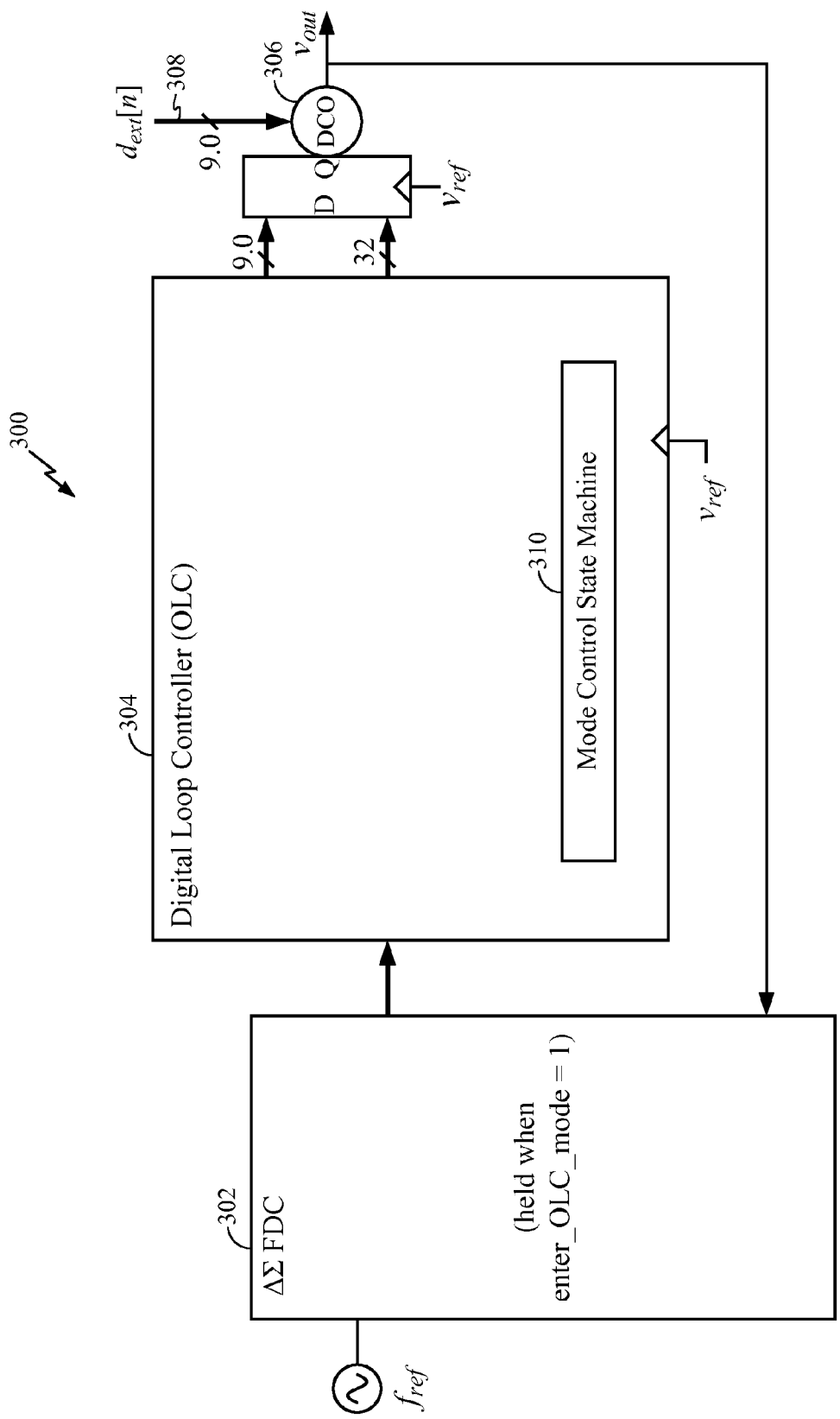
FIG. 3 illustrates an example block diagram of the FDC-PLL during open loop control mode, in accordance with certain aspects of the present disclosure.

FIG. 3 illustrates an example 300 of the FDC-PLL as configured during the open loop control mode, in accordance with certain aspects of the present disclosure. In this configuration, the FDC-PLL 300 is not phase locked and a user can change the frequency of the DCO 306 as desired by changing the codeword 308, $d_{ext}[n]$. In an aspect of the present disclosure, blocks in the digital loop controller block 104 from FIG. 1 that are not shown in the digital loop controller block 304 in FIG. 3 are not clocked during the open loop control mode.

In an aspect of the present disclosure, the open loop control mode may be entered when the user sets the enter_OLC_mode pin of the FDC-PLL high. It is anticipated that the user will only do this during tracking mode, but it can be allowed regardless of the mode to facilitate debug.

When the open loop control mode is initiated, the charge pump and PFD within the delta-sigma FDC 302 are disabled, and clocking of the 5-level ADC and the data path components within the digital loop controller block shown in FIG. 2 are suspended. From this point in time until the user requests that the open loop control mode be terminated by setting the enter_OLC_mode pin low, the DCO frequency is controlled by the user externally to the FDC-PLL via the codeword 308, $d_{ext}[n]$.

The charge pump and PFD within the delta-sigma FDC 302 can be enabled, and clocking of the 5-level ADC of the delta-sigma FDC 302 can be started when the enter_OLC_mode pin is set low by the user. Upon termination of the open loop control mode, the user is expected to return $d_{ext}[n]$ to the value it had prior to entering the open-loop control mode (although this is not enforced by the FDC-PLL). Regardless of whether the FDC-PLL was in tracking mode at the time it entered the open loop control mode, the digital loop controller block can be configured for tracking mode at this time (e.g., as in the block diagram 200 in FIG. 2). However, in an aspect of the present disclosure, clocking of its data path components may not be started until the output of the 5-level ADC stays in the range {−1, 0, 1} for three consecutive reference periods. This condition indicates that the delta-sigma FDC has established phase lock. Once the condition is detected, clocking of the tracking mode data path components in the digital loop controller block can be restarted, and the FDC PLL may enter the tracking mode discussed above.

In an aspect of the present disclosure, when the droop event terminates, delta-sigma FDC 302 can be allowed to re-lock without affecting the DCO 306. Once the delta-sigma FDC 302 relocks, the digital loop controller 304 can be unfrozen. In an aspect of the present disclosure, the relocking transient may only occur if the DCO frequency drifted during the droop event.

Figure 4:
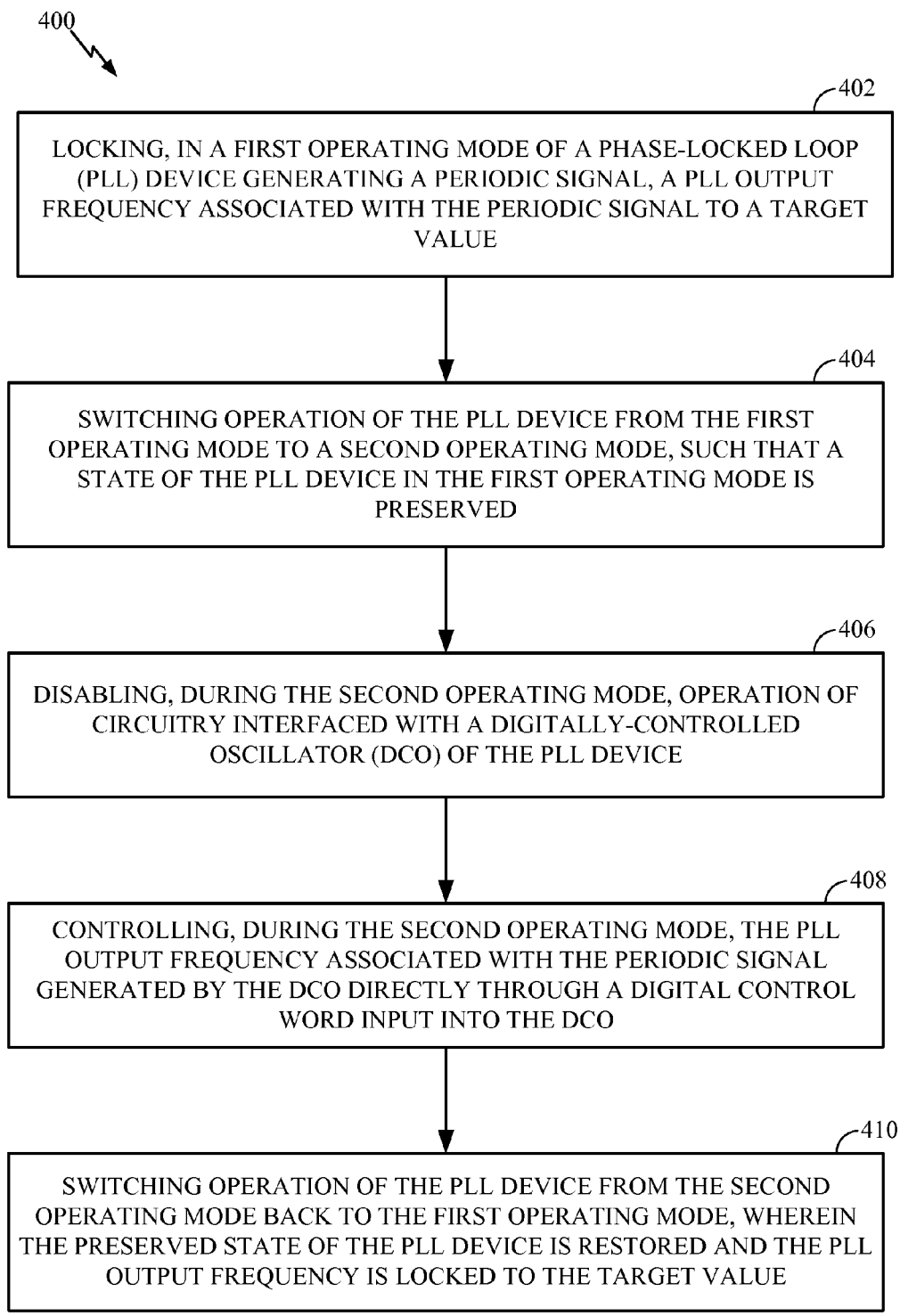
FIG. 4 illustrates a flow diagram of example operations for operating in an open loop control (OLC) mode of the FDC-PLL, in accordance with certain aspects of the present disclosure.

FIG. 4 is a flow diagram of example operations 400 for operating a phase-locked loop (PLL) device for generating a periodic signal, in accordance with certain aspects of the present disclosure. The operations 400 may be performed in hardware, e.g., by components of the example FDC-PLL device 300 from FIG. 3. In an aspect of the present disclosure, the operations 400 may be performed at least in part by a mode control state machine 310 (i.e., a processing system) of the digital loop controller 304 illustrated in FIG. 3.

The operations 400 may begin, at 402, by locking, in a first operating mode of the PLL device (e.g., tracking mode), a PLL output frequency associated with the periodic signal to a target value. At 404, operation of the PLL device may switch from the first operating mode to a second operating mode (e.g., OLC mode), such that a state of the PLL device in the first operating mode is preserved. At 406, during the second operating mode, operation of circuitry (e.g., the FDC 302 and the digital loop controller 304 from FIG. 3) interfaced with a DCO (e.g., the DCO 306) of the PLL device may be disabled. At 408, during the second operating mode, the PLL output frequency associated with the periodic signal generated by the DCO may be controlled directly through a digital control word (e.g., the digital control word 308 from FIG. 3) input into the DCO. At 410, operation of the PLL device may switch from the second operating mode back to the first operating mode, wherein the preserved state of the PLL device is restored and the PLL output frequency is locked to the target value.

According to aspects of the present disclosure, disabling operation of the circuitry of the PLL device may comprise disabling clocking of a delta-sigma frequency-to-digital converter (FDC) (e.g., the FDC 302) interfaced with the DCO via a digital loop controller (e.g., the digital loop controller 304), and disabling clocking of the digital loop controller interfaced with the DCO. In an aspect, disabling clocking of the delta-sigma FDC may comprise disabling a charge pump and a phase-frequency detector (PFD), and suspending clocking of an analog-to-digital converter interfaced with the charge pump and the PFD. In an aspect, disabling clocking of the digital loop controller may comprise suspending clocking of data path components interfaced with the DCO.

In an aspect of the present disclosure, disabling operation of the circuitry of the PLL device may comprise disabling clocking of a time-to-digital converter interfaced with the DCO via a digital loop controller. In another aspect, disabling operation of the circuitry of the PLL device may comprise disabling clocking of a phase-to-digital converter interfaced with the DCO via a digital loop controller.

In an aspect of the present disclosure, as discussed above, switching operation of the PLL device to the second operating mode may be achieved based on setting an external pin of the PLL device to a defined value during the first operating mode of the PLL device. In an aspect, as discussed above, terminating the second operating mode may be achieved by setting an external pin of the PLL device to a defined value.

According to aspects of the present disclosure, switching operation of the PLL device from the second operating mode back to the first operating mode may comprise enabling clocking of the circuitry after setting an external pin of the PLL device to a defined value. In an aspect, enabling clocking of the circuitry may comprise enabling a charge pump and a phase-frequency detector (PFD) of a delta-sigma frequency-to-digital converter (FDC) (e.g., the FDC 302) interfaced with the DCO via a digital loop controller (e.g., the digital loop controller 304), and starting clocking of an analog-to-digital converter interfaced with the charge pump, the PFD and the digital loop controller.

According to aspects of the present disclosure, switching operation of the PLL device from the second operating mode back to the first operating mode may comprise setting the digital control word to a value it had prior to the PLL device switching operation from the first operating mode to the second operating mode. Furthermore, switching operation of the PLL device from the second operating mode back to the first operating mode may comprise starting clocking data path components of a digital loop controller interfaced with the DCO once an output of an analog-to-digital converter interfaced with the digital loop controller stays in a defined range for a number of consecutive reference periods.

Figure 4A:
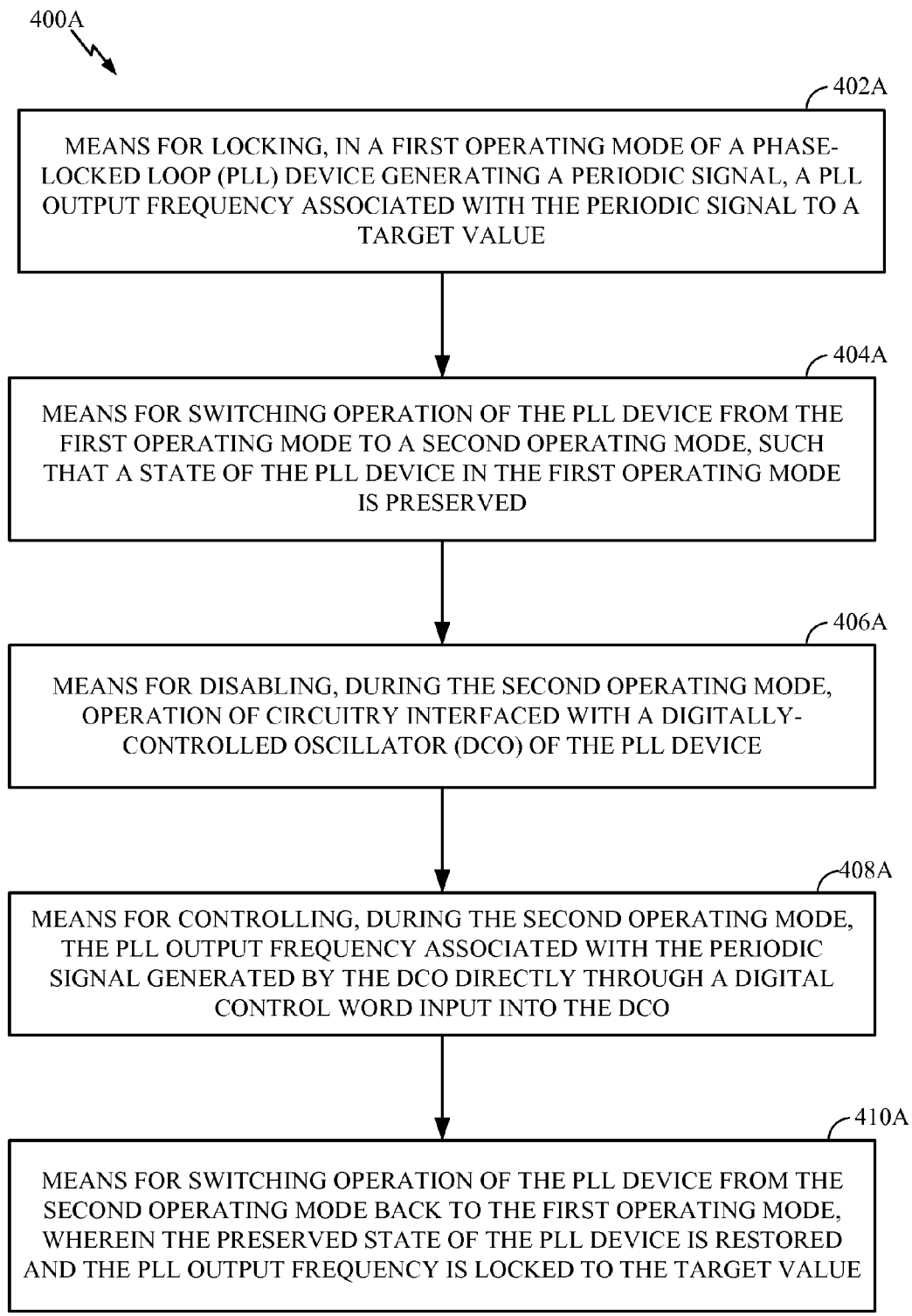
FIG. 4A illustrates example means capable of performing the operations shown in FIG. 4.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. For example, operations 400 illustrated in FIG. 4 correspond to means 400A illustrated in FIG. 4A.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth.

A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for operating a phase-locked loop (PLL) device for generating a periodic signal, comprising:
   locking, in a first operating mode of the PLL device, a PLL output frequency associated with the periodic signal to a target value;
   switching operation of the PLL device from the first operating mode to a second operating mode, such that a state of the PLL device in the first operating mode is preserved;
   disabling, during the second operating mode, operation of circuitry interfaced with a digitally-controlled oscillator (DCO) of the PLL device;
   controlling, during the second operating mode, the PLL output frequency associated with the periodic signal generated by the DCO directly through a digital control word input into the DCO; and
   switching operation of the PLL device from the second operating mode back to the first operating mode, wherein the preserved state of the PLL device is restored and the PLL output frequency is locked to the target value, wherein switching operation of the PLL device from the second operating mode back to the first operating mode comprises:
      setting the digital control word to a value it had prior to the PLL device switching operation from the first operating mode to the second operating mode.

2. The method of claim 1, wherein disabling operation of the circuitry of the PLL device comprises:
   disabling clocking of a delta-sigma frequency-to-digital converter (FDC) interfaced with the DCO via a digital loop controller; and
   disabling clocking of the digital loop controller interfaced with the DCO.

3. The method of claim 2, wherein disabling clocking of the delta-sigma FDC comprises:
   disabling a charge pump and a phase-frequency detector (PFD); and
   suspending clocking of an analog-to-digital converter interfaced with the charge pump and the PFD.

4. The method of claim 2, wherein disabling clocking of the digital loop controller comprises:
   suspending clocking of data path components interfaced with the DCO.

5. The method of claim 1, wherein disabling operation of the circuitry of the PLL device comprises:
   disabling clocking of a time-to-digital converter interfaced with the DCO via a digital loop controller.

6. The method of claim 1, wherein disabling operation of the circuitry of the PLL device comprises:
   disabling clocking of a phase-to-digital converter interfaced with the DCO via a digital loop controller.

7. The method of claim 1, further comprising:
   switching operation of the PLL device to the second operating mode by setting an external pin of the PLL device to a defined value during the first operating mode of the PLL device.

8. The method of claim 1, further comprising:
   terminating the second operating mode by setting an external pin of the PLL device to a defined value.

9. The method of claim 1, wherein switching operation of the PLL device from the second operating mode back to the first operating mode comprises:
   enabling clocking of the circuitry after setting an external pin of the PLL device to a defined value.

10. The method of claim 9, wherein enabling clocking of the circuitry comprises:
   enabling a charge pump and a phase-frequency detector (PFD) of a delta-sigma frequency-to-digital converter (FDC) interfaced with the DCO via a digital loop controller; and
   starting clocking of an analog-to-digital converter interfaced with the charge pump, the PFD and the digital loop controller.

11. The method of claim 1, wherein switching operation of the PLL device from the second operating mode back to the first operating mode comprises:
   starting clocking data path components of a digital loop controller interfaced with the DCO once an output of an analog-to-digital converter interfaced with the digital loop controller stays in a defined range for a number of consecutive reference periods.

12. An apparatus for operating a phase-locked loop (PLL) device for generating a periodic signal, comprising:
   a processing system configured to
   lock, in a first operating mode of the PLL device, a PLL output frequency associated with the periodic signal to a target value,
   switch operation of the PLL device from the first operating mode to a second operating mode, such that a state of the PLL device in the first operating mode is preserved,
   disable, during the second operating mode, operation of circuitry interfaced with a digitally-controlled oscillator (DCO) of the PLL device,
   control, during the second operating mode, the PLL output frequency associated with the periodic signal generated by the DCO directly through a digital control word input into the DCO, and switch operation of the PLL device from the second operating mode back to the first operating mode, wherein the preserved state of the PLL device is restored and the PLL output frequency is locked to the target value, wherein switching operation of the PLL device from the second operating mode back to the first operating mode comprises:
setting the digital control word to a value it had prior to the PLL device switching operation from the first operating mode to the second operating mode; and
a memory coupled to the processing system.

13. The apparatus of claim 12, wherein the processing system is further configured to:
disable clocking of a delta-sigma frequency-to-digital converter (FDC) interfaced with the DCO via a digital loop controller; and
disable clocking of the digital loop controller interfaced with the DCO.

14. The apparatus of claim 13, wherein the processing system is further configured to:
disable a charge pump and a phase-frequency detector (PFD) of the delta-sigma FDC; and
suspend clocking of an analog-to-digital converter interfaced with the charge pump and the PFD.

15. The apparatus of claim 13, wherein the processing system is further configured to:
suspending clocking of data path components of the digital loop controller interfaced with the DCO.

16. The apparatus of claim 12, wherein the processing system is further configured to:
switch operation of the PLL device to the second operating mode based on setting an external pin of the PLL device to a defined value during the first operating mode of the PLL device.

17. The apparatus of claim 12, wherein the processing system is further configured to:
terminate the second operating mode based on setting an external pin of the PLL device to a defined value.

18. The apparatus of claim 12, wherein the processing system is further configured to:
enable clocking of the circuitry after setting an external pin of the PLL device to a defined value.

19. The apparatus of claim 12, wherein the processing system is further configured to:
start clocking data path components of a digital loop controller interfaced with the DCO once an output of an analog-to-digital converter interfaced with the digital loop controller stays in a defined range for a number of consecutive reference periods.

20. An apparatus for operating a phase-locked loop (PLL) device for generating a periodic signal, comprising:
means for locking, in a first operating mode of the PLL device, a PLL output frequency associated with the periodic signal to a target value;
means for switching operation of the PLL device from the first operating mode to a second operating mode, such that a state of the PLL device in the first operating mode is preserved;
means for disabling, during the second operating mode, operation of circuitry interfaced with a digitally-controlled oscillator (DCO) of the PLL device;
means for controlling, during the second operating mode, the PLL output frequency associated with the periodic signal generated by the DCO directly through a digital control word input into the DCO; and
means for switching operation of the PLL device from the second operating mode back to the first operating mode, wherein the preserved state of the PLL device is restored and the PLL output frequency is locked to the target value, wherein switching operation of the PLL device from the second operating mode back to the first operating mode comprises:
setting the digital control word to a value it had prior to the PLL device switching operation from the first operating mode to the second operating mode.

21. The apparatus of claim 20, further comprising:
means for disabling clocking of a delta-sigma frequency-to-digital converter (FDC) interfaced with the DCO via a digital loop controller; and
means for disabling clocking of the digital loop controller interfaced with the DCO.

22. The apparatus of claim 21, further comprising:
means for disabling a charge pump and a phase-frequency detector (PFD) of the delta-sigma FDC; and
means for suspending clocking of an analog-to-digital converter interfaced with the charge pump and the PFD.

23. The apparatus of claim 21, further comprising:
means for suspending clocking of data path components of the digital loop controller interfaced with the DCO.

24. The apparatus of claim 20, further comprising:
means for switching operation of the PLL device to the second operating mode based on setting an external pin of the PLL device to a defined value during the first operating mode of the PLL device.

25. The apparatus of claim 20, further comprising:
means for terminating the second operating mode based on setting an external pin of the PLL device to a defined value.

26. The apparatus of claim 20, further comprising:
means for enabling clocking of the circuitry after setting an external pin of the PLL device to a defined value.

27. The apparatus of claim 20, further comprising:
means for starting clocking data path components of a digital loop controller interfaced with the DCO once an output of an analog-to-digital converter interfaced with the digital loop controller stays in a defined range for a number of consecutive reference periods.

28. A computer-readable medium having instructions executable by a computer stored thereon for:
locking, in a first operating mode of a phase-locked loop (PLL) device for generating a periodic signal, a PLL output frequency associated with the periodic signal to a target value;
switching operation of the PLL device from the first operating mode to a second operating mode, such that a state of the PLL device in the first operating mode is preserved;
disabling, during the second operating mode, operation of circuitry interfaced with a digitally-controlled oscillator (DCO) of the PLL device;
controlling, during the second operating mode, the PLL output frequency associated with the periodic signal generated by the DCO directly through a digital control word input into the DCO; and
switching operation of the PLL device from the second operating mode back to the first operating mode, wherein the preserved state of the PLL device is restored and the PLL output frequency is locked to the target value, wherein switching operation of the PLL device from the second operating mode back to the first operating mode comprises:

setting the digital control word to a value it had prior to the PLL device switching operation from the first operating mode to the second operating mode.

* * * * *